(12) United States Patent
Chaintreuil et al.

(10) Patent No.: US 9,843,288 B2
(45) Date of Patent: Dec. 12, 2017

(54) PARALLEL ELECTRIC ARC DETECTION ACROSS THE MAIN TERMINALS OF A PHOTOVOLTAIC INSTALLATION

(71) Applicant: Commissariat a l'energie atomique et aux energies alternatives, Paris (FR)

(72) Inventors: Nicolas Chaintreuil, Montmelian (FR); Alexandre Plissonnier, Pont-de-Claix (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/915,504

(22) PCT Filed: Aug. 27, 2014

(86) PCT No.: PCT/EP2014/068164
§ 371 (c)(1),
(2) Date: Feb. 29, 2016

(87) PCT Pub. No.: WO2015/028505
PCT Pub. Date: Mar. 5, 2015

(65) Prior Publication Data
US 2016/0218669 A1 Jul. 28, 2016

(30) Foreign Application Priority Data
Aug. 29, 2013 (FR) ...................... 13 58269

(51) Int. Cl.
*G01R 31/26* (2014.01)
*H02S 50/10* (2014.01)
*H02S 50/00* (2014.01)

(52) U.S. Cl.
CPC .............. *H02S 50/10* (2014.12); *H02S 50/00* (2013.01); *G01R 31/26* (2013.01)

(58) Field of Classification Search
CPC .... G01R 29/027; G01R 31/40; G01R 31/025; G01R 31/02; G01R 31/12; G01R 31/024; H02S 50/00; H02S 50/10; H02S 40/36
See application file for complete search history.

(56) References Cited

U.S. PATENT DOCUMENTS

| 4,736,267 A | 4/1988 | Karlmann et al. |
| 4,937,697 A | 6/1990 | Edwards et al. |

(Continued)

FOREIGN PATENT DOCUMENTS

| CN | 1129809 A | 8/1996 |
| CN | 101246195 A | 8/2008 |

(Continued)

OTHER PUBLICATIONS

Fritz Schimpf, et al., "Recognition of Electric Arcing in the DC-wiring of Photovoltaic Systems", Telecommunications Energy Conference, pp. 1-6, (Oct. 18, 2009), XP031579534.

(Continued)

*Primary Examiner* — Minh N Tang
(74) *Attorney, Agent, or Firm* — Oblon, McClelland, Maier & Neustadt, L.L.P.

(57) ABSTRACT

A method detecting a parallel arc in a photovoltaic device, including N (N=1 or N>1) photovoltaic modules, connected to a charge device having a capacitive behavior for the modules, the method including: a) detecting, across main terminals of the device, evolution of voltage over time, at least during formation of the electric arc; b) identifying a negative voltage variation between a first zone with stable voltage and a second zone with stable voltage for a duration of at least 5 μs, which immediately follows the voltage variation, and c) determining whether the voltage variation is between a maximum value Vmax, greater than or equal to 100 V, and a minimum value Vmin, less than or equal to 30 V, with a fall time of this variation between a minimum (Continued)

duration Tmin greater than or equal to 0.01 µs and a maximum duration Tmax less than or equal to 10 µs.

20 Claims, 4 Drawing Sheets

(56) References Cited

U.S. PATENT DOCUMENTS

| | | | |
|---|---|---|---|
| 5,452,223 | A | 9/1995 | Zuercher et al. |
| 5,561,605 | A | 10/1996 | Zuercher et al. |
| 5,726,505 | A | 3/1998 | Yamada et al. |
| 5,914,590 | A | 6/1999 | Wacknov et al. |
| 5,939,871 | A | 8/1999 | Tanaka |
| 6,111,767 | A | 8/2000 | Handleman |
| 6,339,538 | B1 | 1/2002 | Handleman |
| 6,469,487 | B2 | 10/2002 | Ewert et al. |
| 6,504,692 | B1 | 1/2003 | MacBeth et al. |
| 6,683,766 | B1 | 1/2004 | Guo et al. |
| 7,233,135 | B2 | 6/2007 | Noma et al. |
| 7,453,308 | B2 | 11/2008 | Tihanyi |
| 7,817,391 | B2 | 10/2010 | Kimber |
| 8,570,017 | B2 | 10/2013 | Perichon et al. |
| 8,576,520 | B2 | 11/2013 | Pamer et al. |
| 2006/0198167 | A1 | 9/2006 | Nakamura |
| 2006/0256492 | A1 | 11/2006 | Zhao et al. |
| 2007/0133135 | A1 | 6/2007 | Kilroy et al. |
| 2007/0208981 | A1 | 9/2007 | Restrepo et al. |
| 2008/0094867 | A1 | 4/2008 | Muller et al. |
| 2008/0180866 | A1 | 7/2008 | Wong |
| 2010/0085669 | A1 | 4/2010 | Rivers, Jr. |
| 2010/0164459 | A1 | 7/2010 | Perichon et al. |
| 2010/0176445 | A1 | 7/2010 | Hsieh |
| 2011/0019444 | A1 | 1/2011 | Dargatz et al. |
| 2011/0141644 | A1 | 6/2011 | Hastings et al. |
| 2012/0118348 | A1 | 5/2012 | Buller |
| 2012/0134058 | A1 | 5/2012 | Pamer et al. |
| 2012/0174961 | A1 | 7/2012 | Larson et al. |
| 2012/0206843 | A1 | 8/2012 | Dargatz et al. |
| 2014/0247066 | A1 | 9/2014 | Chaintreuil et al. |
| 2016/0181799 | A1* | 6/2016 | Kanemaru ............. H02S 50/00 307/78 |
| 2016/0276977 | A1 | 9/2016 | Chaintreuil et al. |

FOREIGN PATENT DOCUMENTS

| | | |
|---|---|---|
| DE | 3429469 A1 | 2/1986 |
| EP | 1 796 238 B1 | 1/2013 |
| EP | 146318881 | 4/2015 |
| FR | 2 912 848 A1 | 8/2008 |
| FR | 2965626 A1 | 4/2012 |
| FR | 2965627 A1 | 4/2012 |
| FR | 2965628 A1 | 4/2012 |
| JP | 5-284654 A | 10/1993 |
| JP | 5-343722 A | 12/1993 |
| JP | 7-44252 | 2/1996 |
| JP | 10-289025 A | 10/1998 |
| JP | 11-579 A | 1/1999 |
| JP | 11-214735 | 8/1999 |
| JP | 11-312022 | 11/1999 |
| WO | WO95/25374 | 9/1995 |
| WO | WO 98/44398 A1 | 10/1998 |
| WO | WO 2006/029360 A1 | 3/2006 |
| WO | WO 2008/125915 A2 | 10/2008 |
| WO | WO 2010/072717 A1 | 7/2010 |
| WO | 2011/011711 A2 | 1/2011 |
| WO | 2011/017721 A1 | 2/2011 |
| WO | WO 2011/022340 A2 | 2/2011 |
| WO | WO 2012/012486 | 1/2012 |

OTHER PUBLICATIONS

Richard Mehl, et al., High Voltage DC Protection of High Voltage DC Next Generation Smart Datacom Power Distribution with Solid State Hybride Circuit Breakers and Arc Fault Detection Modules (AFDM), Telecommunications Energy Conference, pp. 1-6, (Sep. 30, 2012), XP032276433.

International Search Report dated Nov. 12, 2014 in PCT/EP14/068164 Filed Aug. 27, 2014.

French Search Report dated Mar. 20, 2014 in French Application No. 13 58269 Filed Aug. 29, 2013.

French Preliminary Search Report dated Mar. 15, 2012 in Patent Application No. FR 1156012 (with English Translation of Category of Cited Documents).

"Mitigation and Analysis of Arc Faults in Automotive DC Networks," Schoepf, Thomas J., *IIEE Transactions of Components and Packing Technologies*, vol. 28, No. 2, Jun. 2005, pp. 319-326.

"Elektrische Sicherheit in Photovoltaik-Anlagen, Bopp, von Georg, *Forschungverund Sonnenenergie: Themen 92/93*" (with English abstract).

Combined Chinese Office Action and Search Report dated Jun. 1, 2015 in Patent Application No. 201280033220.3 (with English language translation).

\* cited by examiner

Background

Background

PARALLEL ELECTRIC ARC DETECTION ACROSS THE MAIN TERMINALS OF A PHOTOVOLTAIC INSTALLATION

TECHNICAL FIELD AND PRIOR ART

The invention concerns photovoltaic installations and, in particular, electric arc detection means in these installations.

Installations using photovoltaic panels (PV) are destined for development. However, this type of device is ageing and failures may appear over time. These failures can be benign (for example: shutdown, loss of production, reduced yield, etc.) however can also be more serious if a parallel electric arc appears. Indeed, the consequence of such a phenomenon can, in the worst case scenario, trigger a fire that could result in the destruction of the building in which a PV module is installed. A parallel arc is created between points or areas with different potentials.

FIG. 1A shows a known type of photovoltaic installation with a string 100 of 3 photovoltaic modules 1, 2, 3 and a converter (or inverter) 10, connected to the power grid 12. This representation is simplified, as a string generally comprises more than 3 modules. Furthermore, an installation can include several chains 100, 101, etc. in parallel, as illustrated in FIG. 1B.

A parallel electric arc can occur across the terminals of several strings, for example between points A and B in FIG. 1B, between the photovoltaic modules and the inverter 10, these 2 points A and B having different potentials.

We are therefore looking to develop systems designed to detect a parallel electric arc across the main terminals of a photovoltaic installation as soon as it appears, in order to break it and limit its influence as far as possible on the installation and its environment.

Known electric arc detection solutions in low-voltage direct or alternating current installations are mainly based on ultrasonic detection (via the acoustic signature of the arc) or radiofrequency detection (via the RF signature of the arc) or even based on heat measurements (infrared signature of the arc). The signature of a phenomenon is the set of characteristics and their values that enable it to be identified in a certain manner.

For PV installations, the same type of detector is beginning to be developed by some laboratories or industrialists.

The main restriction of these systems is the means they implement to measure the signature. Indeed, given that the signatures are complex and generally involve high frequencies (for acoustic and RF signatures), they require very heavy software processing, with a high sampling rate and therefore expensive components. Moreover, the processing time, including interference or noise discrimination from the signature of the arc, can be high and range from several seconds to several minutes.

These solutions therefore do not meet the need for a fast, reliable and low-cost safety solution.

Methods are known for detecting series electric arcs in a PV system, however these methods are not adapted to suit the detection of parallel arcs, in particular across the main terminals of a photovoltaic installation.

For example, document FR 2912848 describes how to detect a series arc using the measurement of a fast voltage variation.

Document WO 2011/17721 describes a method based on a mean current measurement, the evolution of which is observed. This solution requires long measurement and long processing methods.

Document WO 2011/11711 describes a method based on comparing a current signature and a voltage signature on a power converter for a photovoltaic module. The fact of having to compare the current and voltage involves developed measurement means and computing power, and is thus expensive.

Other methods are known for detecting an arc, however they are not necessarily compatible with devices that operate under direct current. Hence, document US2008/180866 covers the detection of electric arcs on an AC installation using current measurements. Its teachings are not applicable to the case of an installation that may potentially operate under direct current, as is the case of a photovoltaic installation.

Document US 2010/085669 covers an electric arc detector based on the software and mathematical processing of a current signal that is amplified and converted into digital values. This approach does not meet the needs of a fast and simple processing solution.

U.S. Pat. No. 6,504,692 describes a method for detecting parallel electric arcs for AC systems. This detection is based on variations in voltage. However, the variation parameters (magnitude, frequency, rise/fall time, etc.) are not the same for the DC part of a photovoltaic installation.

The teachings of this document are therefore not applicable to the problem posed here, which involves finding a method for characterising parallel electric arcs occurring across the terminals of a photovoltaic installation, including in the case of operation under direct current.

Moreover, the solutions proposed in this document are complex.

However, a solution to this problem must preferably be fast and simple, without implementing expensive means.

The teachings of this document are therefore not applicable to the problem posed here, which involves finding a method for characterising parallel electric arcs occurring across the main terminals of a photovoltaic installation.

A solution to this problem must preferably be fast and simple, without implementing expensive means.

DESCRIPTION OF THE INVENTION

This document describes a method for detecting a parallel arc in a photovoltaic device, comprising N (N=1 or N>1) photovoltaic modules, connected to a charge device having a capacitive behaviour for the modules, this method comprising:

a) detecting, across the main terminals of said device, the evolution of the voltage over time, at least during the formation of the electric arc, b) identifying a negative voltage variation, or voltage variation in the negative direction, between a first zone ($R_1$), during which the voltage has a substantially stable slope and a second zone ($R_2$), during which the voltage has a substantially stable slope for a duration of at least 5 µs, which immediately follows said voltage variation, and c) determining whether the voltage variation is comprised between a maximum value Vmax, greater than or equal to 100 V, and a minimum value Vmin, less than or equal to 30 V, with a fall time of this variation comprised between a minimum duration Tmin greater than or equal to 0.01 µs and a maximum duration Tmax less than or equal to 10 µs.

According to one embodiment, the determination step c) takes place:

on the one hand by analysing the slope of the voltage variation and determining whether this slope is between:

a minimum value, given by the ratio of Vmin/Tmax, and a maximum value, given by the ratio of Vmax/Tmin, and, on the other hand, by determining whether the voltage variation is comprised between a minimum value Vmin, less than or equal to 30 V, and a maximum value Vmax, greater than or equal to 100 V, or whether the rise time of this variation is comprised between a minimum duration Tmin greater than or equal to 0.01 µs and a maximum duration Tmax less than or equal to 10 µs.

Advantageously, passive and/or active filtering of the evolution of the voltage over time takes place.

The evolution of the voltage over time can be digitised, whereby the steps a) to c) are performed based on digital voltage values.

The charge device can include a converter, an inverter or a battery.

According to one specific application, the current is a direct current.

The invention further relates to a device for detecting a parallel arc in a photovoltaic device, comprising N (N=1 or N>1) photovoltaic modules, connected to a charge device having a capacitive behaviour for the modules, this device comprising:

a) means for detecting, across the main terminals (A, B) of said device, the evolution of the voltage over time, at least during the formation of the electric arc, b) means for identifying a negative voltage variation, or voltage variation in the negative direction, between a first zone ($R_1$), during which the voltage has a substantially stable slope and a second zone ($R_2$), during which the voltage has a substantially stable slope for a duration of at least 5 µs, which immediately follows said voltage variation, and c) means for determining whether the voltage variation is comprised between a maximum value Vmax, greater than or equal to 100 V, and a minimum value Vmin, less than or equal to 30 V, with a fall time of this variation comprised between a minimum duration Tmin greater than or equal to 0.01 µs and a maximum duration Tmax less than or equal to 10 µs.

According to one embodiment, said means for determining whether the voltage variation is between said maximum value Vmax and said minimum value Vmin, with a fall time for this variation of between Tmin and Tmax:

analyse on the one hand the slope of the voltage variation and determine whether this slope is between:
a minimum value, given by the ratio of Vmin/Tmax,
and a maximum value, given by the ratio of Vmax/Tmin, and, on the other hand, determine whether the voltage variation is comprised between a minimum value Vmin, less than or equal to 30 V, and a maximum value Vmax, greater than or equal to 100 V, or whether the rise time of this variation is comprised between a minimum duration Tmin greater than or equal to 0.01 µs and a maximum duration Tmax less than or equal to 10 µs.

Such a device can advantageously include means for filtering frequencies at least equal to 100 Hz.

Passive and/or active filtering means for filtering the evolution of the voltage over time can be provided for.

Preferably, such a device comprises analogue and digital filtering means.

Means can be provided for digitising the voltages measured.

The device having a capacitive behaviour for the modules can include a converter, an inverter or a battery.

DETAILED DESCRIPTION OF THE SPECIFIC EMBODIMENTS

Figure 1A:
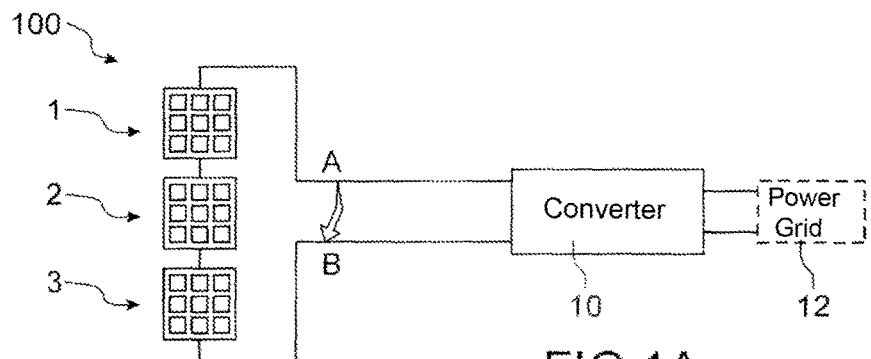
FIGS. 1A and 1B schematically show known types of photovoltaic installations.
Figure 1B:
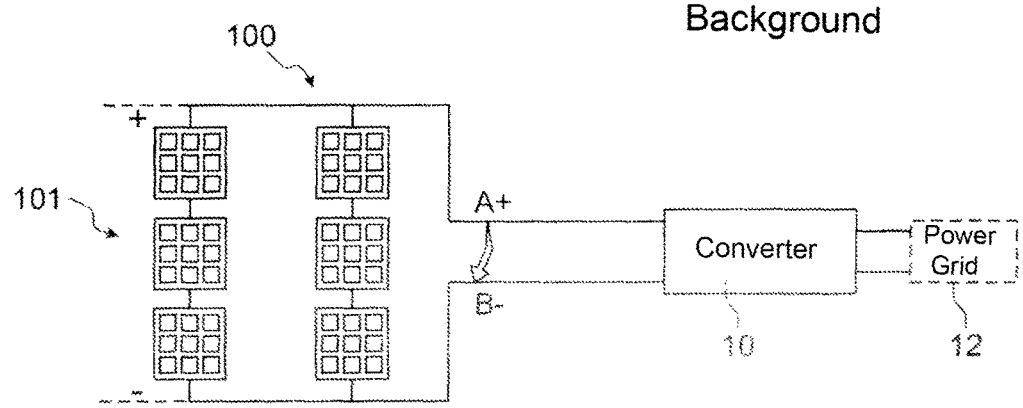
Figure 1C:
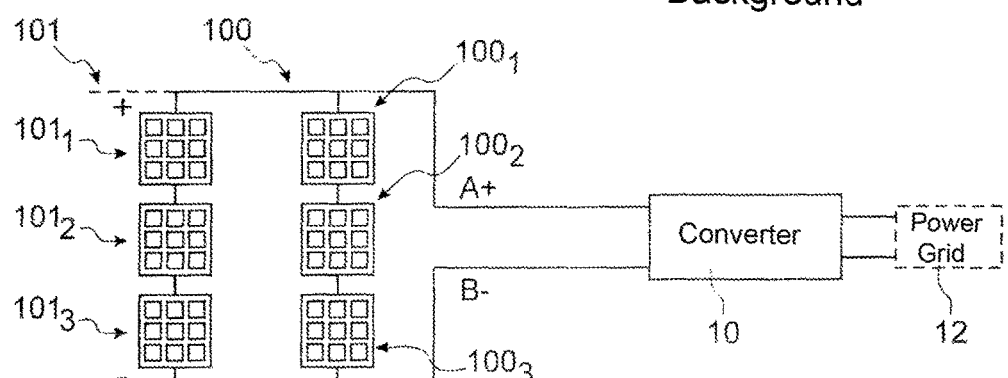
FIG. 1C schematically shows a general structure of a photovoltaic installation, with means for detecting a parallel arc, positioned between the photovoltaic module and the converter.

FIG. 1C schematically shows the structure of a photovoltaic installation (the abbreviation PV is also used in the remainder of the description hereinbelow), comprising 2 strings 100, 101 of photovoltaic modules $100_1$, $100_2$, $100_3$, $101_1$, $101_2$, $101_3$, the different modules $100_1$-$100_3$, $101_1$-$101_3$ of the same string being connected in series. A photovoltaic module refers to a monolithic assembly of photovoltaic cells.

This description is not limited to one or two strings, each comprising three photovoltaic modules, but applies to any number $n_{mod}$ of said modules in a string and/or any number $N_c$ of strings.

An element 10 imposes a capacitive charge at the output of the installation, or has a capacitive behaviour for the modules, such as a converter, inverter or a battery.

This element 10 is connected to the power grid 12.

Via their input capacitance or their capacitive input charge, the means 10 allow for a stable output voltage to be maintained for the strings of the PV modules throughout the duration of arc generation. As already stipulated hereinabove, an alternative embodiment provides for an inverter or a capacitive charge such as a converter or a battery, which would produce the same stabilising effect.

A parallel electric arc can occur between the main terminals A, B, which have different polarities, as shown in FIG. 1B. Each of the main terminals A, B has the same voltage as one of the 2 ends of each of the strings (in other words: each end of a string has the same potential as one of the 2 main terminals). One end of a string is connected to a single module of the string, which is the module of said end.

The reference 8 designates the means used to measure the voltage between the terminals A, B to which they are connected. These means 8 are used to identify the generation of a parallel electric arc via a voltage measurement. This voltage measurement also corresponds to a measurement of the voltage across the terminals of one or more strings.

The voltage and the current flowing through the photovoltaic modules depend on several parameters (sunshine, temperature) and can vary significantly.

Figure 6:
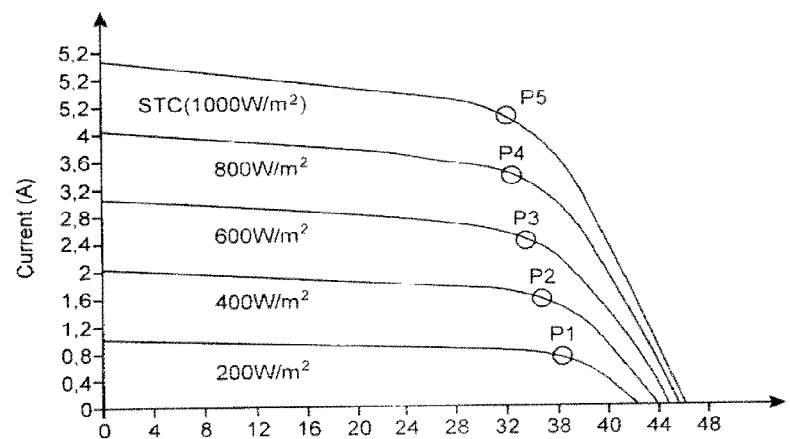
FIG. 6 shows the current/voltage curves characteristic of a photovoltaic module.

FIG. 6 shows the curves that are characteristic of a photovoltaic module according to the level of illumination received (from 200 to 1,000 W/cm$^2$). The current flowing through the module varies greatly according to this illumination (proportionally thereto in a first approximation). The operating points P1, P2, ... Pk on the curves in FIG. 6 are the points at which the module delivers maximum power for a given illumination.

In order to optimise energy generation, the converter or inverter 10 imposes an operating voltage for the modules so that the latter generate the maximum amount of power (this function is known as: MPPT="maximum power point tracking").

When an arc is produced, the final minimum value of the arc voltage $V_{arc}$, is about 10 V. It is linked to the physical properties of an electric arc. Indeed, as previously explained in document FR 2 912 848, an electric arc can be broken down into 3 zones:

1 electrode/air interface zone
1 plasma zone
1 air/electrode interface zone.

The two interface zones appear as a P-N junction of a diode, i.e. a junction between a conductive material and an insulator.

This junction therefore has a fixed potential that is directly linked to the potentials of the materials present. That of air does not vary, however that of the electrode can vary according to whether the electrode is made from copper, aluminium or silver, etc. This potential is therefore present at each interface and is characteristic of the arc. It appears as soon as arcing occurs (before the establishment of the plasma) and its value $V_{arc}$, measured across the terminals of the arc, is between 10 V and 25 V or even 30 V.

Based on the voltage measurement by the means 8, a characteristic signature of a parallel electric arc can be identified. Indeed, this type of electric arc is materialised by a fast drop in voltage.

Figure 2A:
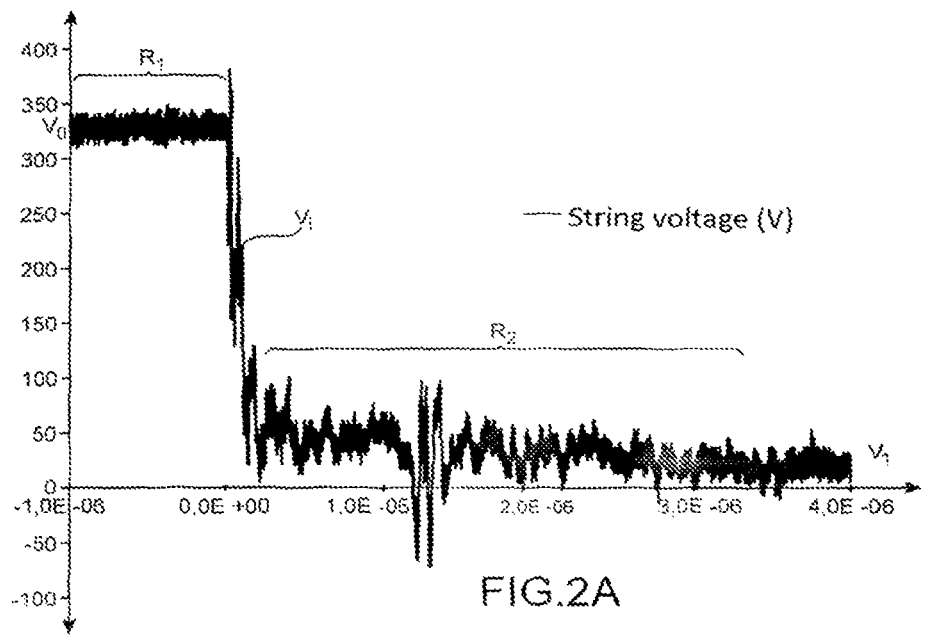
FIGS. 2A and 2B show the variations of a voltage over time when a parallel electric arc occurs across the terminals of a photovoltaic device, the voltage filtered being further shown in FIG. 2B.
Figure 2B:
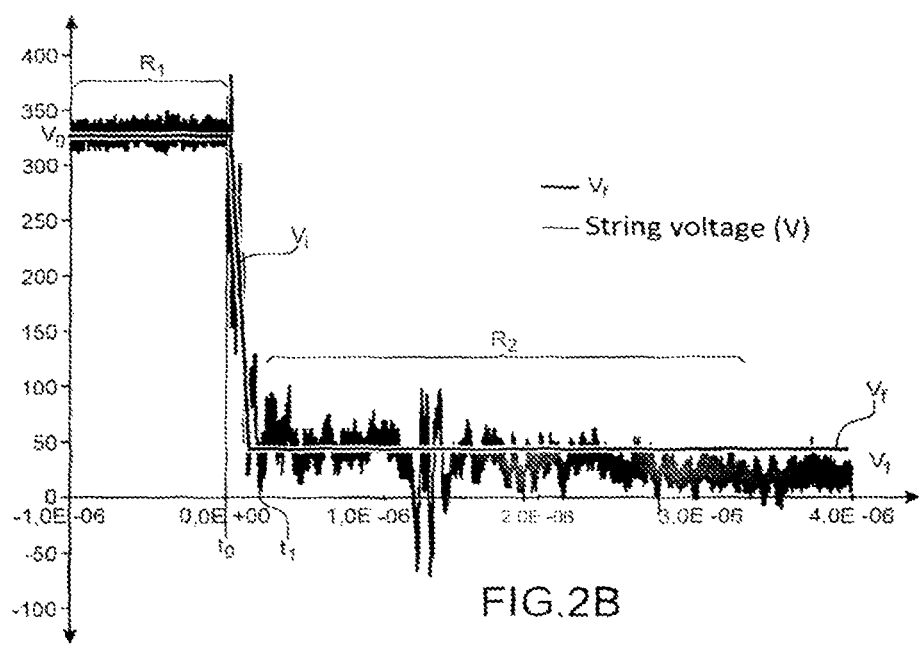

The instant voltage evolution $V_i$ of a parallel electric arc involves high oscillations and can take on the shape shown in FIG. 2A. The voltage $V_f$ resulting from the filtering of the instant voltage $V_i$ is also shown (FIG. 2B). It is noted that the voltage variations occur between a $1^{st}$ stable voltage zone (zone $R_1$ in FIGS. 2A and 2B), at a voltage value $V_0$ known as the initial value, and a $2^{nd}$ stable voltage zone (zone $R_2$ in FIGS. 2A and 2B), at a value $V_{arc}$, the final value of the arc voltage. This $2^{nd}$ stable zone lasts at least several µs, for example at least 5 µs or at least 10 µs. The oscillations observed in the zones $R_1$ and $R_2$ are mainly caused by the measurement.

On a whole, a very clear drop in the voltage measured is observed.

Despite the variable voltage oscillations observed at the beginning of the instant voltage $V_i$ front, the signature of a parallel electric arc between the points A and B is characterised, between the $1^{st}$ stable voltage zone and the $2^{nd}$ stable voltage zone, by a negative evolution $\Delta V$ ($=V_{arc}-V_0$) of the voltage $V_i$ (however also of $V_f$, as the latter is directly deduced from $V_i$, by $V_i$ curve-fitting) of an absolute value between 1,500 V and 10 V. In the example shown in FIGS. 2A and 2B, the absolute value $\Delta V$ is about 350 V.

Another parameter of a parallel electric arc of the type studied herein, in a photovoltaic system, is the fall time $\Delta T$ of the negative variation of the signature of the electric arc (from $t_0$ to $t_1$ on the curve II in FIG. 2B, wherein $t_0$ identifies the moment considered to be the start of the arc and $t_1$ identifies the moment considered to be the end of the arc). $\Delta T$ is measured between the initial value $V_0$ of the voltage and the final value $V_1$ (of Vf), with an error margin, for example ±10%, this error margin being a result of the noise on the waveform. This fall time is linked to the physical properties of the photovoltaic modules and their dynamic behaviour. A photovoltaic module represents a certain variable stray capacitance value. It therefore has a response time to a voltage step characteristic to it. However this time varies very little according to the different photovoltaic module technology implemented.

It can, for example, be between 0.01 µs and 10 µs, for a voltage variation measurement between the terminals A and B.

These specific features are used to identify, between 2 stable voltage zones, the signature of a parallel electric arc across the main terminals of a photovoltaic installation.

Measured between the terminals A and B (therefore with the detection means positioned as shown in FIG. 1C), the voltage will change from a value $V_{MPP}$ (initial voltage difference between A and B), for example about 350 V, to a value $V_{arc}$ between 10 and 30 V in a time $t_{arc}$ between 0.01 µs and 10 µs, i.e. a maximum value of the slope of this voltage variation (in the case where $V_{MPP}=350$ V) of between about 30,000 V/µs and 35,000 V/µs and a minimum value (for $V_{MPP}=350$ V) of between about 300 V/µs and 350 V/µs.

For another VMPP value:
 the maximum value of the slope of this voltage variation will be between about $(V_{MPP}-30)$ V×10²/µs and $(V_{MPP}-10)$ V×10²/µs;
 the minimum value of the slope of this voltage variation will be between about $(V_{MPP}-30)$ V×0.1/µs and $(V_{MPP}-10)$ V×0.1/µs;

More generally, a parallel arc between the points A and B can be characterised by:
 the duration $\Delta T$ and the slope of the voltage variation during its evolution over time;
 or the voltage variation $\Delta V$ and the slope of the voltage variation during its evolution over time;
 or a voltage variation $\Delta V$ and the duration $\Delta T$.

The presence of an arc is therefore materialised by:
 a maximum voltage variation between about 1,500 V and 100 V, with a fall time of between about 0.01 µs and 10 µs;
 or a voltage front slope between 1.5×10⁵ V/µs and 10 V/µs, with a fall time of between about 0.01 µs and 10 µs;
 or a voltage front slope between 1.5×10⁵ V/µs and 10 V/µs, with a maximum voltage variation of between 1500 V and 100 V.

In other words, it is determined, in one way or another, whether the voltage variation is comprised between about 1,500 V and 100 V, with a fall time of this variation comprised between a duration Tmin greater than or equal to 0.01 µs and a duration Tmax less than or equal to 10 µs.

Data processing means 77 (FIGS. 3-5), specially programmed for this purpose, are designed to analyse the voltage values measured to establish the presence of a parallel arc. These means 77 can, for example, include a microprocessor or a computer.

The invention is described hereinabove for applications with direct current, wherein the means 10 are used to maintain a stable output voltage for the strings of the PV modules. However, the inverter 10 can produce interference, which in turn results in a variable, sine-wave voltage at a frequency that is, for example, equal to 100 Hz.

The teachings of this invention remain applicable to this type of situation.

Figure 7:
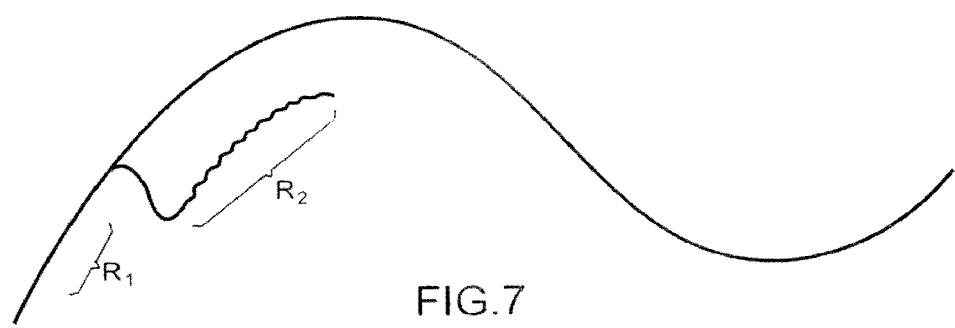
FIG. 7 shows a portion of a sine-wave signal, for example in the case of an inverter generating interference.

A part of the corresponding sine-wave signal is shown in FIG. 7.

A voltage variation described hereinabove takes place on such a signal, between the portions of the signal that show substantially stable slopes.

Thus, the variation described hereinabove with reference to FIGS. 2A and 2B takes place in this case between a portion $R_1$ of the signal that shows a substantially constant, positive slope and another portion $R_2$ of the signal that also shows a substantially constant, positive slope. Similar reasoning applies if the arc occurred in a decreasing portion of the sine-wave signal, whereby the voltage variation would occur between a portion of the signal that shows a substantially constant, negative slope and another portion of the signal that also shows a substantially constant, negative slope.

For these reasons, the invention can further be applied to the case of a system operating using alternating current.

Example embodiments of a device for detecting an arc implement technical means allowing for the acquisition of the signal and the discrimination of a signature of the aforementioned type.

Different technical solutions are capable of achieving this.

Figure 3:
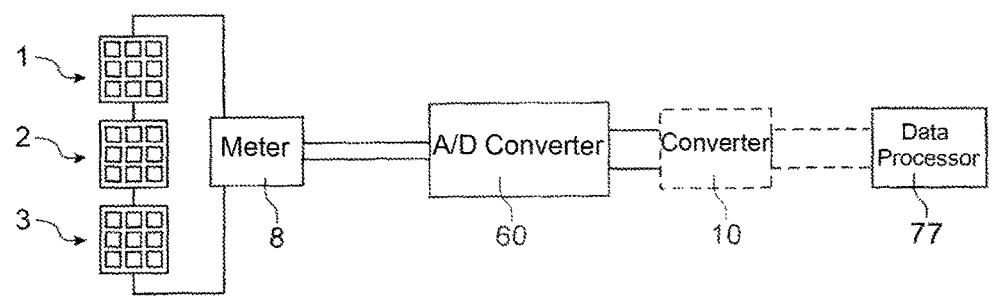
FIGS. 3-5 show various embodiments of a device according to the invention.

One example embodiment of such a device is illustrated in FIG. 3: this is an embodiment in digital mode, using an acquisition string, comprising the means 8 forming the arc detector and an analogue/digital converter 60 designed to differentiate the signature from other ambient noise. This digital embodiment does not require filtering. According to the calculation method used, the converter 60 samples the signal at a frequency of between 100 kHz and 5 MHz. Sampling at about 100 kHz, therefore at low frequency, is very advantageous in terms of cost. Advantageously, the sampling frequency is between 90 kHz and 600 kHz. Digital processing means are used to calculate the different values and implement the processing steps according to the invention.

Data processing means 77, specially programmed for this purpose, are designed to store and/or analyse the voltage values measured to establish the presence of a parallel arc. These means 77 can, for example, include a microprocessor or a computer.

Other technical solutions, such as analogue solutions, are possible. We are therefore looking to isolate the voltage measured, or the signature of the electric arc, from other voltage interference observed at the input of the voltage detection means. Indeed, in a PV system, the voltage is not perfectly smooth. Interference remains, in particular at 100 Hz, with a sine-wave shape and a variable magnitude depending on the level of power injected by the inverter 10 on the grid: these are harmonics generated by the inverter, which are transferred to its input and therefore to the continuous part of the PV installation. Some interference can have a higher frequency, for example Dirac-type interference, which represents interference caused by motor start-up or any other element located close to the PV installation and emitting electromagnetic interference. For example, a motor can be located in an environment close to the PV installation and emit an interfering electromagnetic field or be powered by the inverter output.

Finally, interference linked to the use of a powerline communication (PLC) device can disrupt voltage detection means. This interference can originate, for example, from the presence in the PV installation of smart systems communicating via powerline communication (PLC) means.

Figure 4:
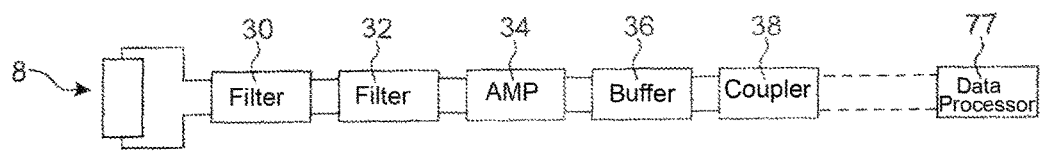

One analogue example embodiment consists in the use of cascading passive analogue filters, as illustrated in FIG. 4. In this figure, as well as in the following figure, the reference 8 designates the voltage measurement means in FIG. 1C.

In this example, the circuit comprises 3 stages: a $1^{st}$ passive filter 30 (band-pass filter), a $2^{nd}$ passive filter 32 (high-pass filter) and an amplifier 34.

These stages can be grouped together into a single stage. These stages can be followed by a buffer 36 and by disconnection means 38 for disconnecting the PV module from the electric circuit to secure the former. The buffer is used to filter the bouncing signals of the signal measured. An electric arc is rarely evident and is formed from a multitude of arcing processes before stabilising its plasma: only the first arcing must be detected.

The filters 30, 32 are used to isolate the correct frequency (with the characteristic rise or fall time having the aforementioned values) and therefore to reject the low frequencies (preferably below 1,000 Hz) and the high frequencies.

This filtering can also take place with active elements thus increasing selectivity (by about 6 instead of about 1 or 2 with passive filtering). The device therefore includes means forming an active filter (high-pass filter), means forming an amplifier and comparator, means forming a passive filter (low-pass filter), means forming a passive filter (low-pass filter), a buffer and disconnection means.

Figure 5:
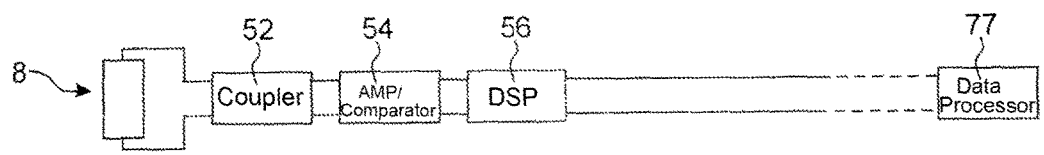

Finally, a combination of analogue and digital means is possible, as illustrated in FIG. 5, comprising:
disconnection means 52,
means 54 forming an amplifier and comparator,
digital processing means 56.

Other embodiments are possible, for example the amplification and comparison functions are not necessarily within a same device 54.

In the various analogue devices described, the voltage variation and corresponding characteristic time (fall time) are detected, and in particular:
via the comparator for the voltage variation,
via the filter selectivity, the rise or fall time for this variation, between 0.01 µs and 10 µs (case of a parallel arc) or between 0.5 µs and 5 µs (case of a series arc).

On a whole, the more a digital system is preferred, the faster the device response time. A fast response time (of several tens of microseconds) is advantageous as this allows the appearance of the arc plasma to be limited, thus preventing physical damage to the system. The lower the number of components required to perform the function, the lower the cost, hence the interest in working only on the voltage signature and in analogue mode (not in current or RF with heavy digital processing).

The invention claimed is:
1. A method for detecting a parallel arc in a photovoltaic device, including N (N=1 or N>1) photovoltaic modules, connected to a charge device having a capacitive behavior for the modules, the method comprising:
   a) detecting, by a detector and across main terminals of the photovoltaic device, evolution of voltage over time;
   b) identifying, by a data processor, a negative voltage variation between a first zone, during which the voltage has a substantially stable slope and a second zone, during which the voltage has a substantially stable slope for a duration of at least 5 µs, which immediately follows the voltage variation; and
   c) determining, by the data processor, whether the voltage variation is between a maximum value Vmax, greater than or equal to 100 V, and a minimum value Vmin, less than or equal to 30 V, with a fall time of this variation between a minimum duration Tmin greater than or equal to 0.01 µs and a maximum duration Tmax less than or equal to 10 µs.

2. The method according to claim 1, wherein the determining c) takes place:
by analyzing the slope of the voltage variation and determining whether this slope is between:
a minimum value, given by the ratio of Vmin/Tmax, and a maximum value, given by the ratio of Vmax/Tmin;
and, by determining whether the voltage variation is between a minimum value Vmin, less than or equal to 30 V, and a maximum value Vmax, greater than or equal to 100 V, or whether a rise time of the variation is between a minimum duration Tmin greater than or equal to 0.01 μs and a maximum duration Tmax less than or equal to 10 μs.

3. The method according to claim 1, wherein passive and/or active filtering of the evolution of the voltage over time takes place.

4. The method according to claim 1, wherein the evolution of the voltage over time is digitized, whereby the a) to c) are performed based on digital voltage values.

5. The method according to claim 1, wherein the charge device includes a converter, an inverter, or a battery.

6. The method according to claim 1, wherein a current in the photovoltaic device is a direct current.

7. A device for detecting a parallel arc in a photovoltaic device, including N (N=1 or N>1) photovoltaic modules, connected to a charge device having a capacitive behaviour for the modules, the device comprising:
a) means for detecting, across main terminals of the photovoltaic device, evolution of voltage over time;
b) means for identifying a negative voltage variation between a first zone, during which the voltage has a substantially stable slope and a second zone, during which the voltage has a substantially stable slope for a duration of at least 5 μs, which immediately follows the voltage variation; and
c) means for determining whether the voltage variation is between a maximum value Vmax, greater than or equal to 100 V, and a minimum value Vmin, less than or equal to 30 V, with a fall time of the variation between a minimum duration Tmin greater than or equal to 0.01 μs and a maximum duration Tmax less than or equal to 10 μs.

8. The device according to claim 7, wherein the means for determining determines whether the voltage variation is between the maximum value Vmax and the minimum value Vmin, with a fall time for the variation of between Tmin and Tmax:
by analyzing the slope of the voltage variation and determining whether the slope is between:
a minimum value, given by the ratio of Vmin/Tmax,
and a maximum value, given by the ratio of Vmax/Tmin;
and, by determining whether the voltage variation is between a minimum value Vmin, less than or equal to 30 V, and a maximum value Vmax, greater than or equal to 100 V, or whether a rise time of the variation is between a minimum duration Tmin greater than or equal to 0.01 μs and a maximum duration Tmax less than or equal to 10 μs.

9. The device according to claim 7, further comprising means for removing frequencies at least equal to 100 Hz from the evolution of the voltage over time.

10. The device according to claim 7, further comprising means for passive and/or active filtering of the evolution of the voltage over time.

11. The device according to claim 7, further comprising means for analog and digital filtering of the evolution of the voltage over time.

12. The device according to claim 7, further comprising means for digitizing voltages measured.

13. The device according to claim 7, wherein the charge device having a capacitive behaviour for the modules includes a converter, an inverter, or a battery.

14. A device for detecting a parallel arc in a photovoltaic device, including N (N=1 or N>1) photovoltaic modules, connected to a charge device having a capacitive behaviour for the modules, the device comprising:
a) a detector to detect, across main terminals of the photovoltaic device, evolution of voltage over time;
b) a data processor configured to:
identify a negative voltage variation between a first zone, during which the voltage has a substantially stable slope and a second zone, during which the voltage has a substantially stable slope for a duration of at least 5 μs, which immediately follows the voltage variation, and
determine whether the voltage variation is between a maximum value Vmax, greater than or equal to 100 V, and a minimum value Vmin, less than or equal to 30 V, with a fall time of this variation between a minimum duration Tmin greater than or equal to 0.01 μs and a maximum duration Tmax less than or equal to 10 μs.

15. The device according to claim 14, wherein the data processor determines whether the voltage variation is between the maximum value Vmax and the minimum value Vmin, with a fall time for the variation of between Tmin and Tmax:
by analyzing the slope of the voltage variation and determining whether this slope is between:
a minimum value, given by the ratio of Vmin/Tmax,
and a maximum value, given by the ratio of Vmax/Tmin;
and, by determining whether the voltage variation is between a minimum value Vmin, less than or equal to 30 V, and a maximum value Vmax, greater than or equal to 100 V, or whether a rise time of the variation is between a minimum duration Tmin greater than or equal to 0.01 μs and a maximum duration Tmax less than or equal to 10 μs.

16. The device according to claim 14, further comprising at least a filter removing frequencies at least equal to 100 Hz from the evolution of the voltage over time.

17. The device according to claim 14, further comprising at least one of a passive and active filter to filter the evolution of the voltage over time.

18. The device according to claim 14, further comprising at least one of an analog and digital filter to filter the evolution of the voltage over time.

19. The device according to claim 14, further comprising a converter to digitize the evolution of the voltage over time.

20. The device according to claim 14, wherein the charge device having a capacitive behavior for the modules includes a converter, an inverter, or a battery.

* * * * *